United States Patent
Chen (10) Patent No.: US 7,023,250 B2
(45) Date of Patent: Apr. 4, 2006

(54) PROGRAMMABLE BANDWIDTH DURING START-UP FOR PHASE-LOCK LOOP

(75) Inventor: Shyng Duan Chen, Kirkland, WA (US)

(73) Assignee: Intersil Americas Inc., Milpitas, CA (US)

( * ) Notice: Subject to any disclaimer, the term of this patent is extended or adjusted under 35 U.S.C. 154(b) by 0 days.

(21) Appl. No.: 10/825,326

(22) Filed: Apr. 16, 2004

(65) Prior Publication Data

US 2005/0151594 A1    Jul. 14, 2005

Related U.S. Application Data

(60) Provisional application No. 60/536,304, filed on Jan. 14, 2004.

(51) Int. Cl.
*H03K 5/13* (2006.01)

(52) U.S. Cl. .............. 327/157; 331/17; 331/16
(58) Field of Classification Search ........ 327/156–158, 327/148, 146–147; 331/17, 25, 16, 1 A See application file for complete search history.

(56) References Cited

U.S. PATENT DOCUMENTS

| 5,475,326 | A | * | 12/1995 | Masuda | 327/157 |
| 5,694,062 | A | * | 12/1997 | Welch et al. | 327/3 |
| 5,929,677 | A | * | 7/1999 | Murata | 327/157 |
| 6,229,362 | B1 | * | 5/2001 | Choi | 327/157 |
| 6,853,252 | B1 | * | 2/2005 | Dickmann | 331/16 |

FOREIGN PATENT DOCUMENTS

JP      408307257    * 11/1996

* cited by examiner

*Primary Examiner*—Dinh T. Le
(74) *Attorney, Agent, or Firm*—Graybeal Jackson Haley LLP (57) ABSTRACT

A phase lock loop PLL which includes an oscillator having an oscillator signal whose frequency is related to a received error correction signal and phase frequency detector receiving and comparing the oscillator signal and a reference signal from a master circuit and generating the error correction signal based on the phase difference of the oscillator signal and the reference signal. A filter, including a capacitor, connects the error correction signal from the phase-frequency detector to the oscillator. A rate selector monitors a charge on the capacitor and controls the rate of error connection signals as a function of the charge on the capacitor.

21 Claims, 10 Drawing Sheets

PROGRAMMABLE BANDWIDTH DURING START-UP FOR PHASE-LOCK LOOP

CROSS-REFERENCE

This application claims the benefit of U.S. Provisional Application No. 60/536,304, filed Jan. 14, 2004; is related to U.S. application Ser. No. 10/264,360 entitled PHASE-LOCK LOOP HAVING PROGRAMMABLE BANDWIDTH and U.S. application Ser. No. 10/264,359 entitled PWM CONTROLLER WITH INTEGRATED PLL, both of which were filed on Oct. 4, 2002; and all of which are hereby incorporated by reference.

BACKGROUND OF THE INVENTION

Figure 1:
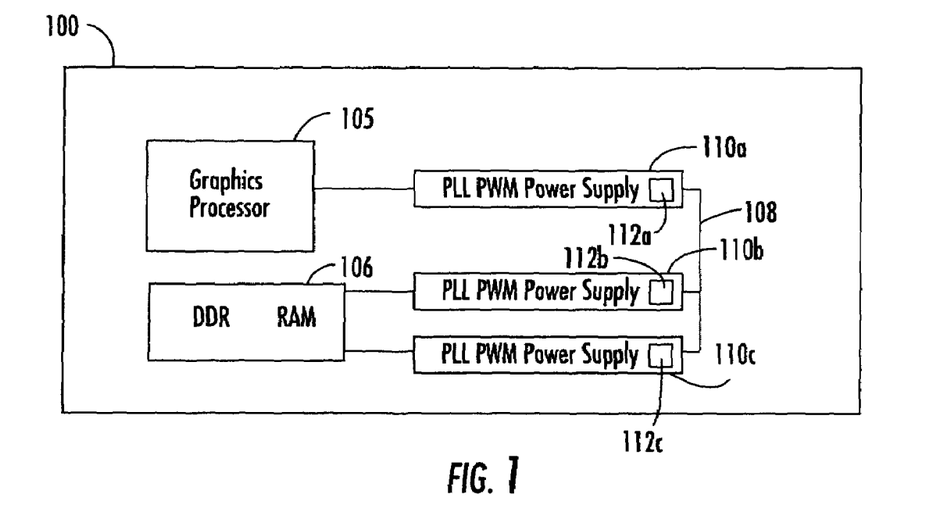
FIG. 1 is a block diagram of a graphic board that utilizes an embodiment of a PWM controller, according to an embodiment of the present disclosure.

A graphics board is a printed-circuit board that typically includes at least one graphics processor and other electronic components that process and display graphics or other video data in a computer system. FIG. 1 is a block diagram of a graphics board 100 that includes a graphics processor 105, as discussed in the aforementioned U.S. applications. Typically, one of the electronic components connected to the graphics processor 105 is a double-data-rate random-access memory (DDS RAM) chip 106. Both the graphics processor 105 and the DDR RAM 106 typically have high power requirements, as compared to other electronic components. For example, the graphics processor 105 typically requires 5–15 amps (A) of power at 1.6 volts (V), and the DDR RAM 106 typically 5–10 A and 10–20 A at 1.25 V and 2.5 V, respectively. Because the processor 105 and DDR RAM 106 have such high power requirements, pulse-width-modulated (PWM) switching power supplies 110a, 110b, and 110c are typically provided for the graphics processor 105 and the DDR RAM 106. A common power supply 108 feed the PWM switching power supplies 110a, 110b and 110c. Typically, the PWM power supplies 110a, 110b and 110c each includes a separate PWM-controller chip 112a, 112b and 112c, although these controllers can be integrated into the graphics processor 105 and DDR RAM 106 chips, respectively.

Ideally, the operating frequencies of the PWM power supplies 110a, 110b and 110c are the same. If, however, these frequencies are different, undesirable "beat" frequencies can result. A beat frequency is equal to the difference between the two frequencies. Unfortunately, the beat frequency can cause undesirable artifacts to appear in a video display.

A technique for reducing or eliminating the beat frequency is for two of the PWM controllers 112b and 112c (slaves) of the graphics board 105 to lock onto the PWM signal of the other PWM controller 112a (master) using a phase-lock loop (PLL). The slave PLLs can each generate one or more slave-PWM output signals that are phase locked to the master-PWM signal and that have the same frequency as the master-PWM signal.

Figure 2:
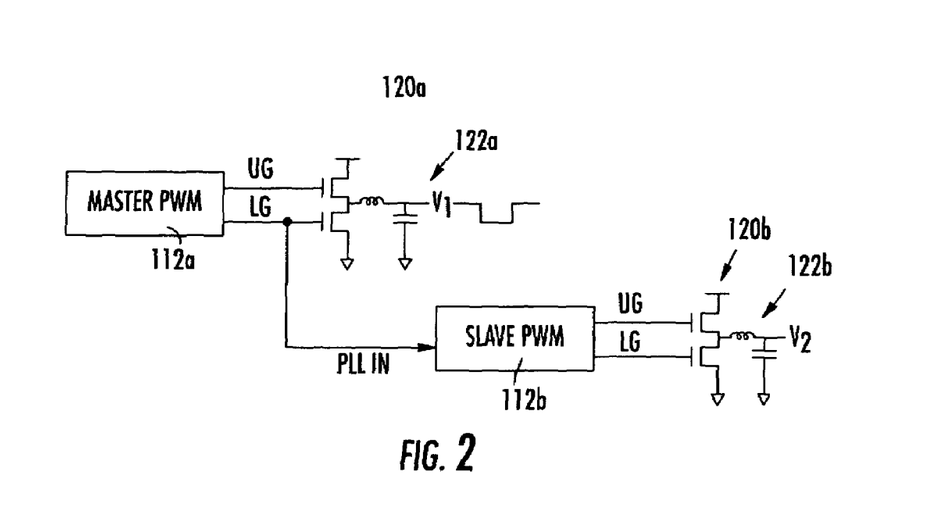
FIG. 2 is a schematic of a master/slave-PWM controller.

As illustrated in FIG. 2, the master-PWM controller 112a provides output signals UG and LG to driver 120a, which provides a signal to integrator 122a. The output of the integrator 122a is V1. The master-PWM controller 112a also has signal LG connected as the input to a slave-PWM 112b. The output signals UG and LG of the slave-PWM 112b are provided to driver 120b, which provides a signal to integrator 122b. The output signal is V2. The slave-PWMs have a tendency to overcorrect if there are disturbances on the input signal. In other systems wherein the input signals to the PWM controllers are a crystal oscillator, there are no missed pulses. However, in PWM master/slave applications, there are missed pulses if the load current is stepped. If there are few missing pulses, it is possible that either the up or down pulses in the pulse width in the PLL will be very wide and drive the voltage control oscillator (VCO) to follow.

Figure 3:
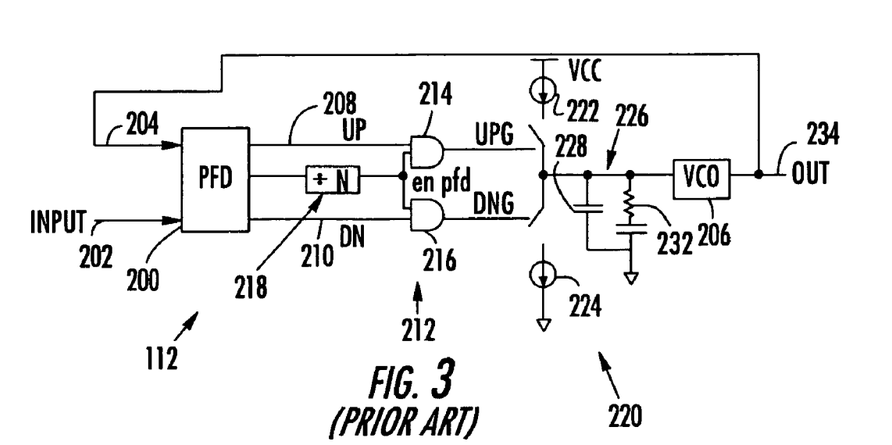
FIG. 3 is a schematic of a type of PLL to which the present disclosure is directed.

An example of this type of PLL is illustrated in FIG. 3 and disclosed in detail in the aforementioned U.S. applications. The input or reference signal IN2 at 202 is provided to a phase frequency detector (PFD) 200. The input signal 202 is compared against a feedback signal 204 coming from VCO 206. Depending upon the frequency difference, an up signal UP 208 or a down signal DN 210 is provided through a switching, gate or logic circuit 212 as UPG and DNG to a charge pump 220. The output of the charge pump 220 is provided through a filter 226 to the VCO 206. The output of VCO 206 is the output signal IN1 at 234, as well as feedback signal 204. A ÷ N counter 218 is responsive to the cycles of the PFD 220 to transmit the up/down signals on 208 and 210 through the gate circuit 212 to operate the charge pump 220. In the above-mentioned applications, the circuit 212 is shown as gated inverters, as well as multiplexes. In FIG. 3, they are illustrated by AND gates 214, 216. It should also be noted that the filter 226 has capacitor 218 in parallel with the series connection resistor 232 and capacitor 230. ÷ N counter 218 is a decrementing counter and maintains a transmission signal having a width of a cycle of the PFD 220. It is the width of this signal through the circuit 212 which causes the overcorrection for the instability in the input signal at 202.

SUMMARY OF THE INVENTION

One embodiment is a phase lock loop PLL which includes an oscillator having an oscillator signal whose frequency is related to a received error correction signal and phase frequency detector receiving and comparing the oscillator signal and a reference signal from a master circuit and generating the error correction signal based on the phase difference of the oscillator signal and the reference signal. A filter, including a capacitor, connects the error correction signal from the phase-frequency detector to the oscillator. A rate selector monitors a charge on the capacitor and controls the rate of error connection signals as a function of the charge on the capacitor.

The PLL may be provided in a slave-PWM controller of a pulse width modulated system wherein the reference signal is from the master-PWM controller, and the oscillator proves a PWM signal. Also, the pulse width modulation system may be part of a power supply circuit having master and slave power supplies. The power supply may be part of a video processor, which may be part of a computer system. The PLL may be provided in a transmitter/receiver.

These and other aspects of the present disclosure will become apparent from the following detailed description of the disclosure, when considered in conjunction with accompanying drawings.

DETAILED DESCRIPTION OF THE PREFERRED EMBODIMENTS

Figure 4:
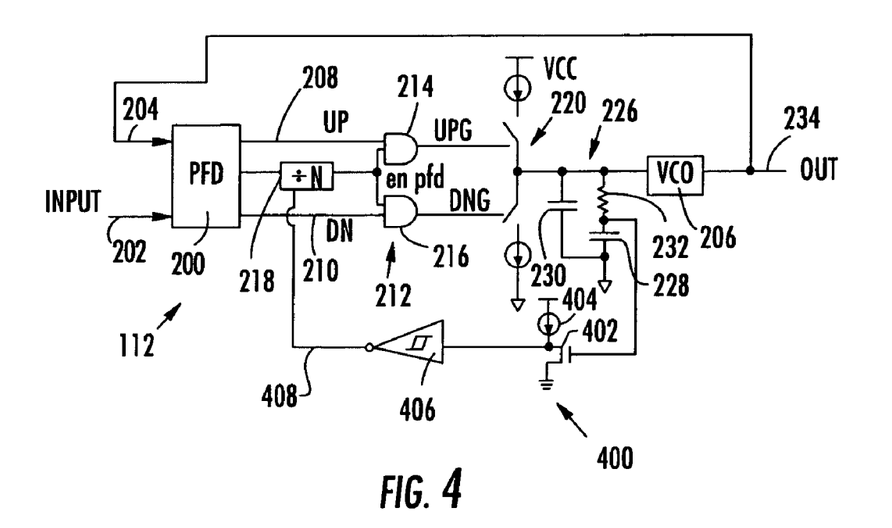
FIG. 4 is a block diagram of an even further embodiment of the PLL, according to the present disclosure, with a variable rate of the transmission of the correction signal.
Figure 5:
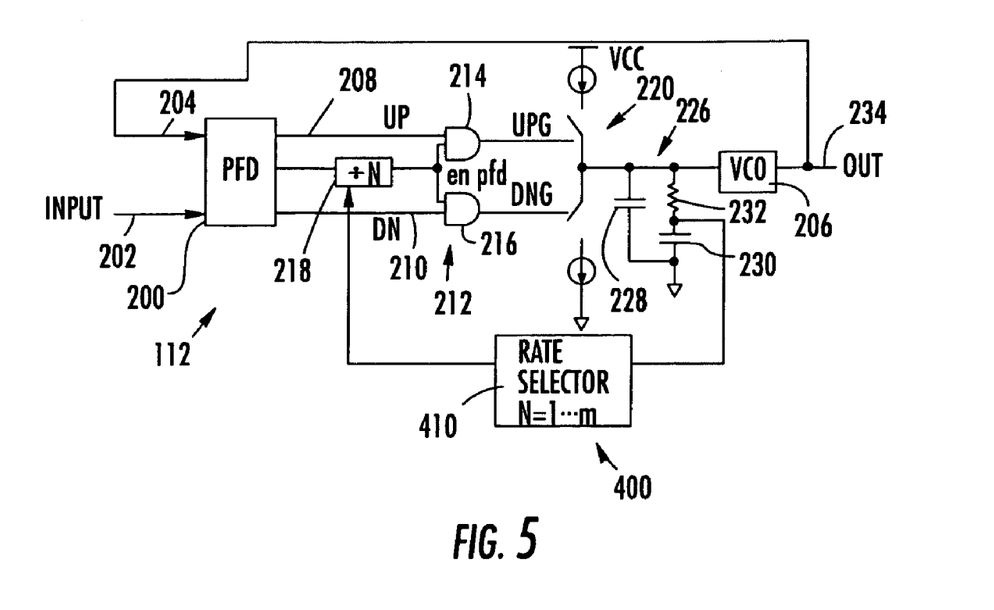
FIG. 5 is an even further embodiment of the PLL, according to the present disclosure, showing a further variable rate of transmission of the correction signal.
Figure 14:
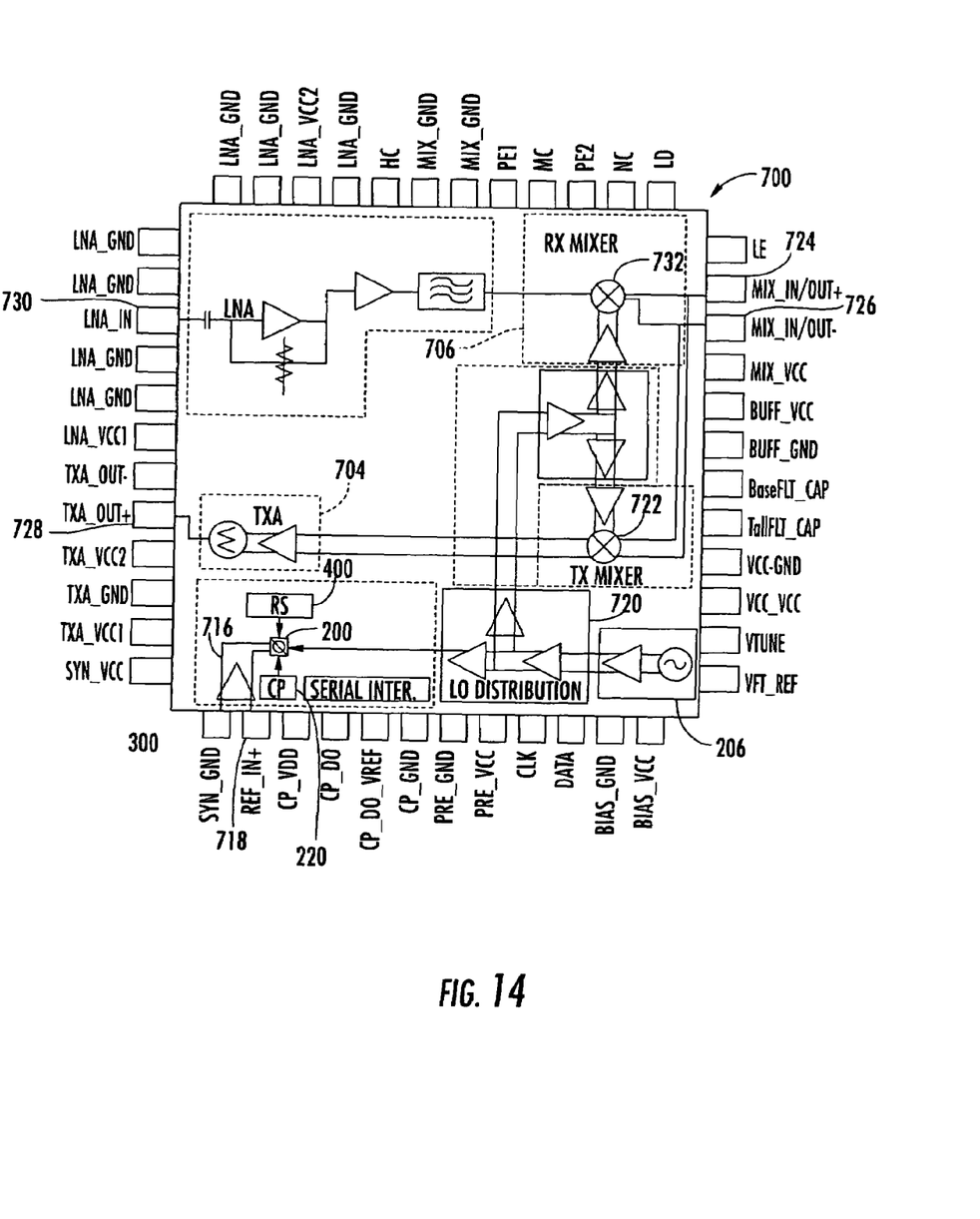
FIG. 14 is a diagram of a Wireless-Area-Network (WAN) transmitter/receiver that can incorporate the PLL of the present disclosure.
Figure 15:
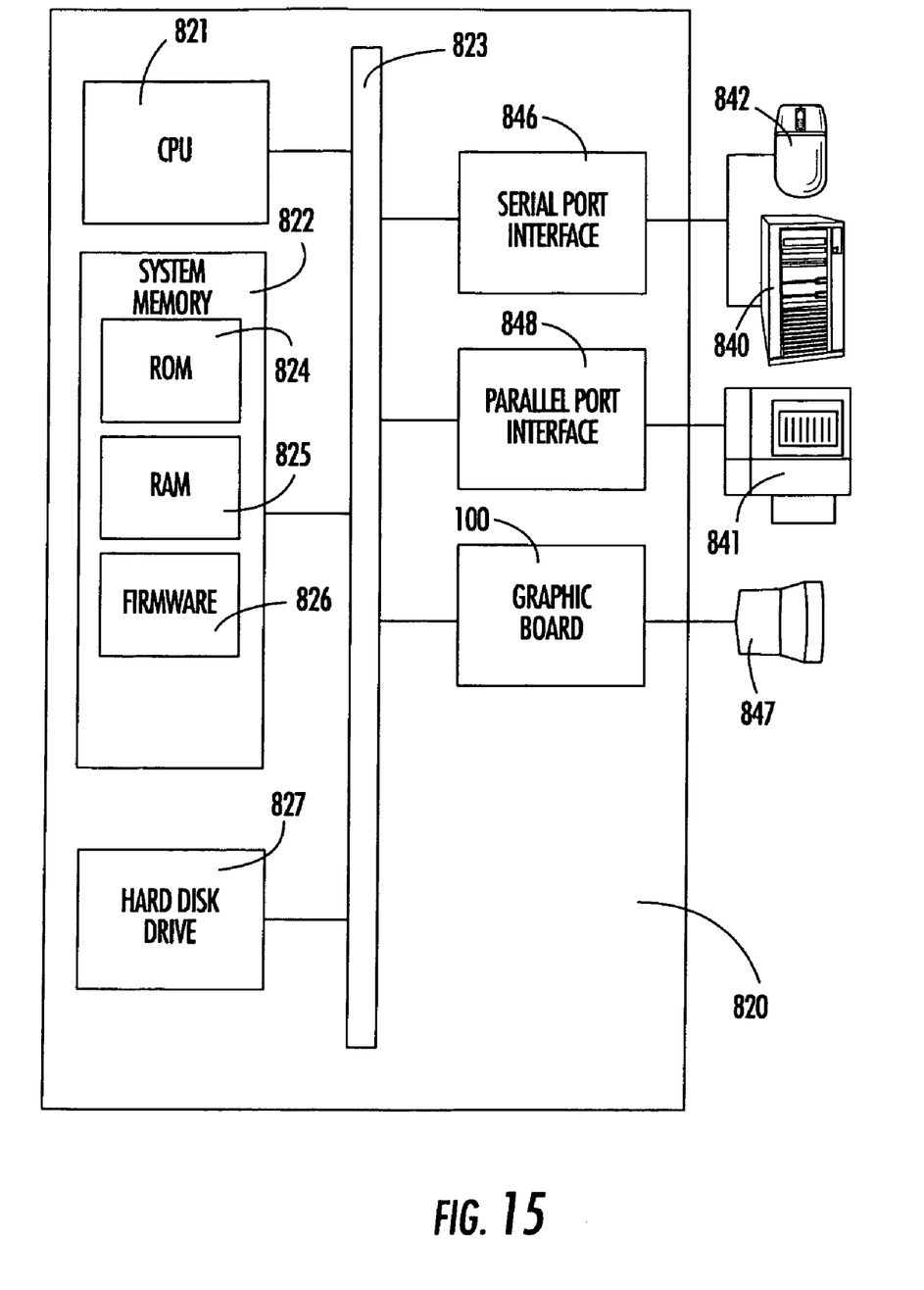
FIG. 15 is a block diagram of a computer that incorporates the graphic board of FIG. 1 with one of the PLLs of the present disclosure.

The PLLs of the present disclosure may be used in the graphic card 100 of FIG. 1, the slave PWM controller 112*b* of FIG. 2, the WAN transmitter/receiver of FIG. 14 or the computer of FIG. 15. They may also be used in other devices requiring a PLL. The embodiments of FIGS. 4 and 5 are PLLs with a variable rate of transmission of the correction signal.

Those elements of the PLL which are common to that shown of FIG. 3 will have the same reference numbers and function the same way as those elements in FIG. 3. The operation of the PLL including the phase frequency detector (PFD) 200, the counter 218, the logic transmission circuit 212, the charge pump 220, the filter 226 and the VCO 206 are well known and will not be described in detail. Reference will be made to the aforementioned applications, as well as other prior art devices.

As previously described with respect to FIG. 3, the frequency of the correction pulses UPG and DNG are defined by the period in which the output en_pfd of the counter 218 activates the gates 212 and 214 and transmits the signal to the charge pump 220. This frequency is a function of the frequency of the input signal 202 and the feedback signal 234 at input 204.

Although the up/down counter 218 has been described in the aforementioned applications as a decrementing counter 218, it can also be an up counting frequency divider.

Figure 6:
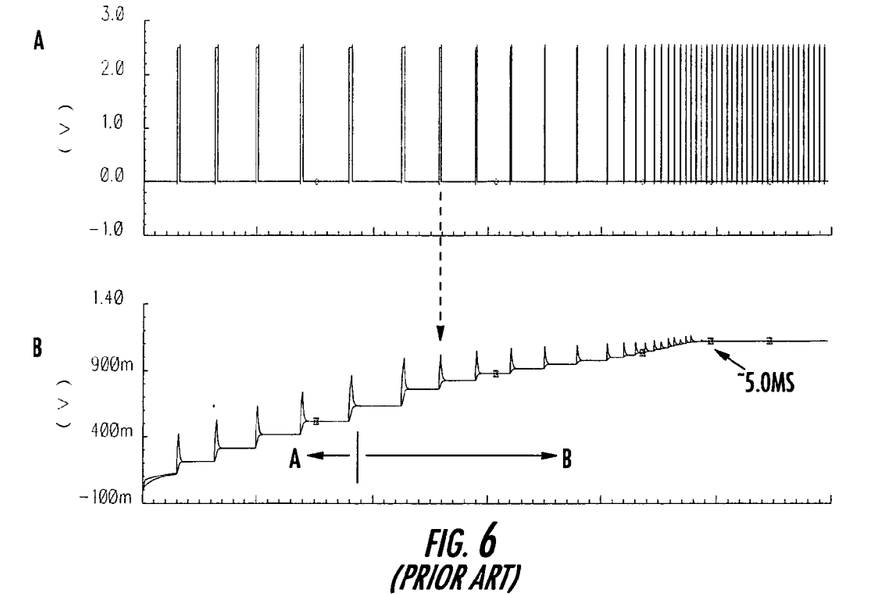
FIGS. 6A and 6B are graphs showing the counter output or gating or transmission signal and the voltage at the loop filter, respectively, of the prior art.
Figure 7:
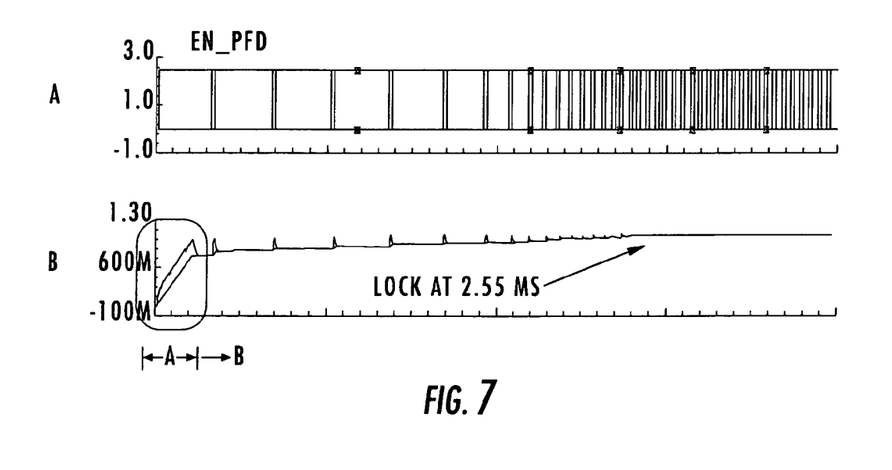
FIGS. 7A and 7B are graphs showing the counter output or gating or transmission signal and of the loop filter for a first embodiment of the present disclosure, respectively.

An improvement to the PLL, as illustrated in FIGS. 4 and 5, is to change the transmission rate or frequency of the PLL. This allows the system to respond differently during start-up and non-lock and during lock. Thus, it is basically changing the bandwidth of the response of the PLL. A rate selector circuit 400, as illustrated in FIG. 4, monitors the charge on capacitor 230 of the filter 226. The amount of charge on capacitor 230 is a function of the operation of the charge pump circuit 220. The rate selector circuit 400 includes a switch or MOS FET 402, which senses the voltage at capacitor 230. Connected to the source of MOS FET 402 is a current source 404. Once the voltage of the capacitor 230 exceeds the threshold of the MOS FET 402, it sends an enabling signal through Schmitt trigger 406 to the counter 218. Prior to this point, counter 218 is disabled or has a count of one and, therefore, for each cycle, an enable pulse is transmitted through to the logic gates 214, 216. Thus, for every cycle, the up and down pulses UP, DN on 208 and 210 are transmitted through as signals UPG and DNG. Thus, initially, the PLL will have a correction every comparison cycle. Once the system gets closer to lock, the voltage on the capacitor 230 is maintained high and, therefore, the counter 218 will slow down the correction frequency by the comparison cycle divided by N. By way of example, whereas the time for lock of a 300 kHz signal using the circuit of FIG. 3 and N=16 is 5 milliseconds, as shown in FIG. 6. With a selector circuit 400 of FIG. 4, the lock time has been decreased to the range of 2.5 milliseconds, as shown in FIG. 7.

Figure 8:
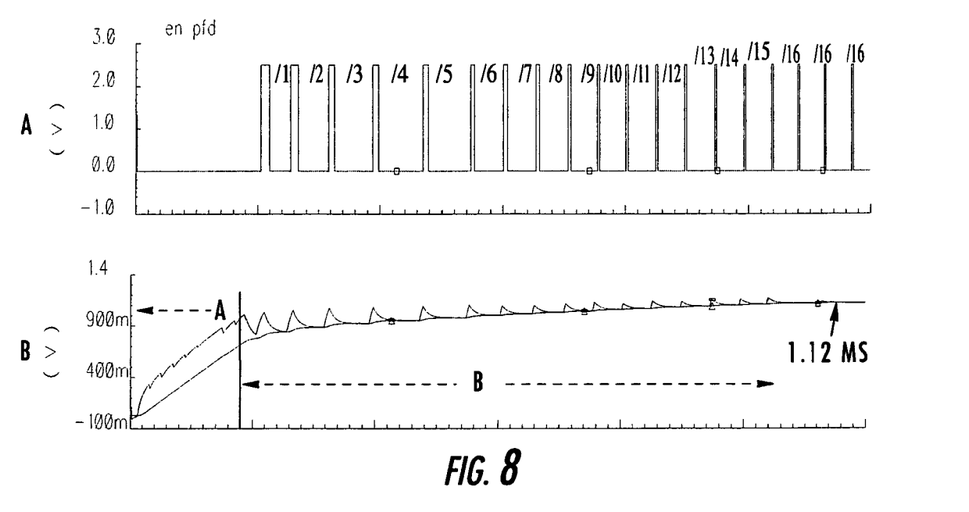
FIGS. 8A and 8B are graphs showing the counter output or gating or transmission signal and of the loop filter of the first and a second embodiment of the present disclosure, respectively.

FIG. 5 shows another embodiment of the rate selector 400. In this case, the rate selector 410 has more than one adjustment value, wherein N may be 1 to M cycles. The rate selector 410 may be a state machine which senses various levels of voltage on the capacitor 230 and sets the appropriate rate to the counter 218. For example, using a count of sixteen, the various levels or thresholds may set a count of 2, 4, 8, 12, 16. Alternatively, the state machine, after reading a first threshold, may incrementally or sequentially increase the count of counter 218. Thus, the lock process may be initially sped up to get to lock faster and then slowed down to maintain lock. By way of example, whereas the time for lock of a 300 kHz signal using the circuit of FIG. 3 and N=16 is in the range of 5 milliseconds, as shown in FIG. 6. With a selector circuit 400 of FIG. 5, the lock time has been decreased to the range of 1 milliseconds, as shown in FIG. 8. Thus, the PLLs of FIGS. 4 and 5 are variable bandwidth PLLs.

The output signal en_pfd of the counter 218 is illustrated in FIG. 6A. The pulse opens or turns off the charge pump 220. In FIG. 6A, enable count pulses are every sixteen comparison cycles for the example used. The resulting voltage on the filter 226 is illustrated in FIG. 6B. Each time the output counter is provided, there is a spike in the filter voltage. The circuit of FIG. 5 reaches a lock at approximately 5.0 milliseconds.

The regions A and B are provided in FIG. 6B for a point of reference when compared to FIGS. 7B and 8B. The demarcation between regions A and B is when the voltage on the capacitor 230 of the filter 226 reaches the preset threshold. Thus, region A is the region in which the counter 218 would be disabled, and the charge pump 220 would provide a signal every comparison cycle. Region B is where the rate selector 400 provides a variable rate to achieve the desired lock results.

FIGS. 7A and 7B show the graphs for the embodiment of FIG. 4. The output of the counter signal en_pfd is illustrated in graph A, and the resulting voltage of the output of the filter 226 is shown as graph B. The charge pump 220 open signals are shown at the pulses in graph A, which produce the spikes in graph B. In region A, the counter 218 is disabled, and the charge pump 220 is activated every comparison cycle. After a given threshold is reached, the charge pump 220 is actuated every time the counter 218 reaches its preset value. In the example used, this is sixteen comparison cycles. As previously discussed, using the device and method of FIG. 4, the lock time is decreased approximately in half from 5 milliseconds to 2.553 milliseconds. In region B, the charge pump 220 is activated every sixteen comparison cycles in the given example.

A second embodiment is illustrated in FIG. 8. In the particular method shown, the rate selector 400 disables the counter 218 such that the charge pump 220 is activated every comparison cycle in the region A of the graph. This takes benefit of the increased tracking of lock illustrated in FIG. 7. In region B, instead of counting and providing an output en_pfd every sixteen cycles, the rate selector 400 causes the counter 218 to progressively and sequentially increase from every cycle up to once every sixteen cycles. This results in a lock time of 1.12 milliseconds compared to the lock time of 2.553 of FIG. 7 using only the region A speed-up and the lock time of 5 milliseconds of FIG. 6 of the prior art. Although the example shown is a progressive and sequential increase of the count from 1 to 16, M may be a number other than 16. The increments may be greater than one, as well as other variations.

Figure 9:
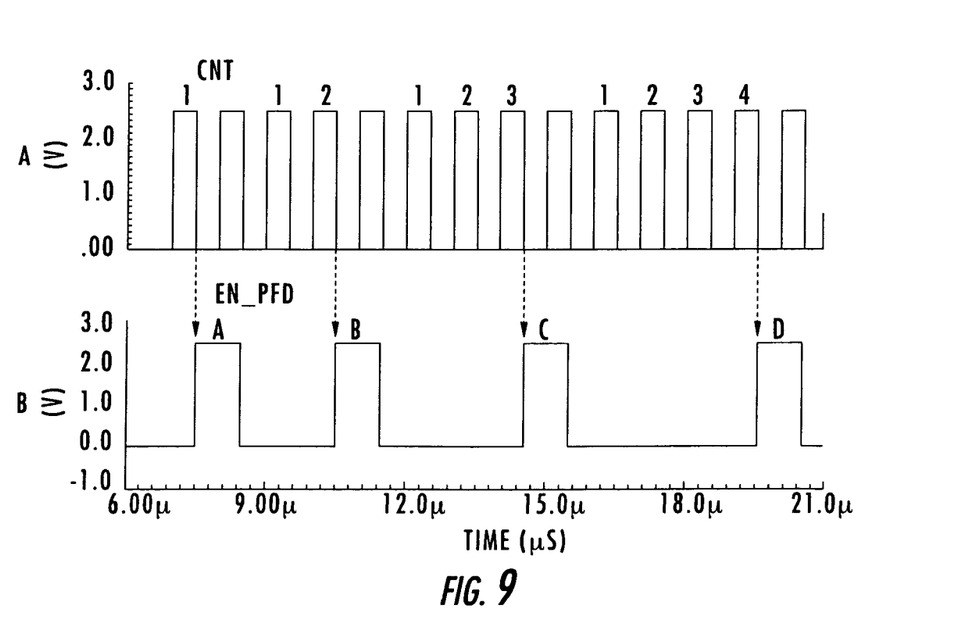
FIGS. 9A and 9B are graphs showing the correspondence between the count pulse cnt and the gating or en_pfd pulse output of the counter.
Figure 10:
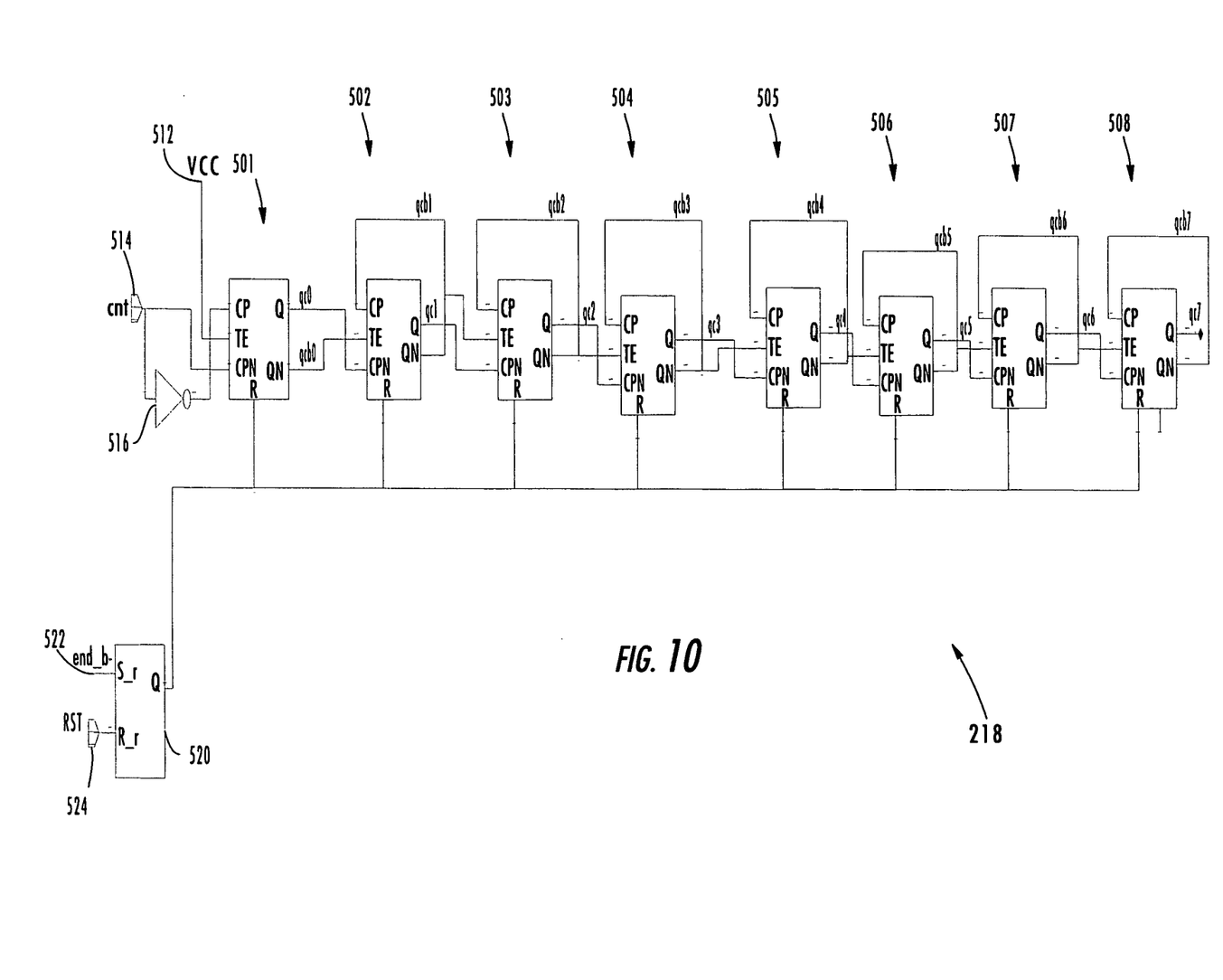
FIG. 10 is a circuit diagram of the counting stage of an incremental counter, according to the present disclosure.

FIGS. 9A and 9B are graphs of the PFD 200 illustrating the relationship between the counter comparison cycle cnt of the PFD 200 and the output en_pfd of the counter 218, respectively, for the progressions 1, 2, 3 and 4. In reviewing FIG. 9A, every time the counter 218 reaches its preset count, the output of the counter en_pfd goes high. The next count cnt is used to reset the counter 218 and bring the output of the counter en_pfd low. As the counter 218 is sequenced from 1 to 4, the resulting counter output pulses A, B, C and D are produced with increased spacing. The counter 218 and rate selector 400 that produce the sequential rate change illustrated in FIGS. 8 and 9 are shown in FIGS. 10 and 11, respectively.

The counter 218 includes eight stages 501–508. Each stage is illustrated, for example, as a D flip flop. The first stage 501 has a data input TE connected at 516 to a fixed voltage. Its clock input CPN is connected to the count input cnt at 514, and its clock CP input is connected to the inverse of the count input cnt through inverter 516. The outputs Q and QN of each of the stages are connected to CPN and CP, respectively, of the next stage. For stages 502–508, the QN output is fed back to its data input D. The reset terminal of each of the stages 501–508 is connected to the output of SR flip flop 520. The set input 522 of flip flop 520 receives signal end_b, and its reset input at 524 is the reset signal RST.

Figure 11:
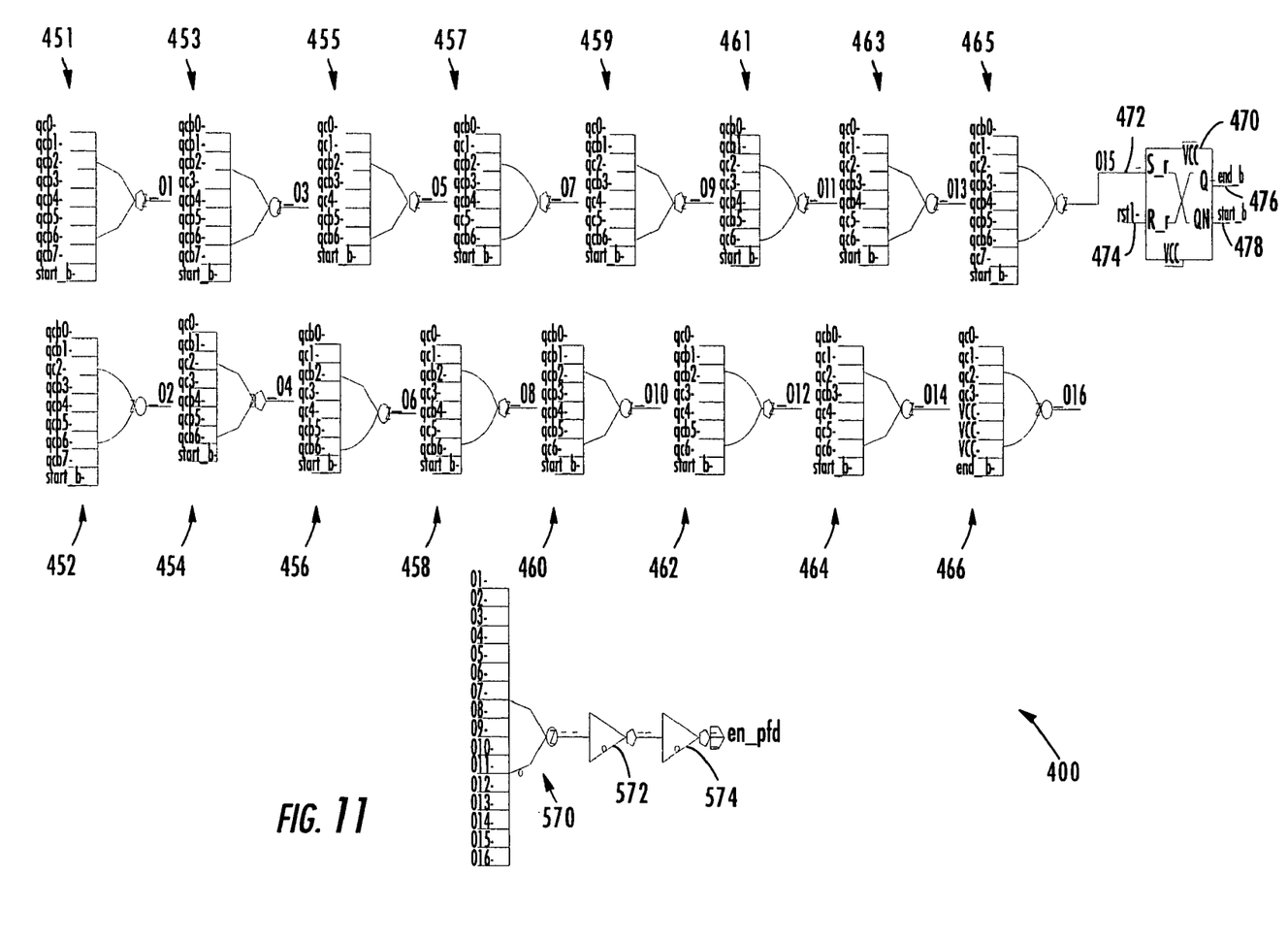
FIG. 11 is a circuit diagram of the logic of the rate selector of the incremental counter, according to the present disclosure.

The output of each of the stages 501–508 (namely, qc and qcb) are used in the logic of the rate selector 400 illustrated in FIG. 11. As will be noted in the discussion of FIG. 11, all eight stages 501–508 are used in the start-up region B to sequentially increase the count from 1 to 16. After 16 is reached, only the first four stages 501–504 are used in the counter 218.

The rate selector 400 includes sixteen NAND gates 451–466. Each NAND gate has an input from one or more of the counting stages 501–508 and provides a count of 1–16, respectively. This produces the ÷ N results of the progressive count. A NAND gate by definition has a low output when all of its inputs are high. Connected to the first fifteen NAND gates 451–465 is a start_b signal, which indicates that the B region of the speed-up portion of the cycle has been initiated. Thus, the first fifteen gates 451–465 provide an output in sequence. The last gate 466, which represents a ÷ 16 count, has an input of end_b. This is at the end of that portion of the start-up cycle, which is the increasing sequence. This deactivates the gates 451–465 and allows only the gate 466 to operate providing a ÷ 16 signal.

The start_b and end_b signals are produced by flip flop 470, which is illustrated as an RS flip flop having its S input 472 connected to the output of the ÷ 15 NAND gate 465. Its reset input 474 receives the reset signal RST. The Q output 470 of the flip flop 470 is the end_b signal, and the QN output 475 is the start_b signal.

The outputs of all of the NAND gates 451–466 are provided to NAND gate 570. The output of NAND gate 570 is connected through two inverters 572, 574 to provide the charge pump enable signal en_pfd. As discussed with respect to FIG. 9, the output of the counter 218 or the charge pump enable signal en_pfd goes high when the output of any of the NAND gates 451–466 is low and goes low when the outputs of all of the NAND gates 451–466 are high. Thus, when one of the NAND gates 451–466 goes low, en_pfd goes high.

Initially, the outputs of all of the stages 501–508 are low. Since at least one input of all of the NAND gates 451–466 is from a QC output and it being low, all of the outputs of the NAND gates 451–466 are high. Since the input to NAND gate 557 are all high, its output en_pfd is low. At count 1, NAND gate 451 changes from a high to a low output, since all of its inputs are high. Thus, one of the inputs to NAND gate 570 is low, and the output of the circuit en_pfd becomes high. After the second counter pulse cnt, NAND gate 451 returns to its high state, and the other gates 452–466 remain at their high state. Thus, all of the inputs to the NAND gate 570 are high, and the output en_pfd returns to low.

For the third and fourth count pulses, all of the gates 451–466 remain at a high output. At the termination of the fourth pulse, gate 452, having all of its inputs high, will become low. This provides a low input to NAND gate 570 producing a high output. An output at en_pfd stays high until the termination of the fifth pulse.

This sequence is repeated by the gates 451–466 sequentially increasing the ÷ count from 1 to 16. Once the gate 465 indicating a count of 15 has terminated, flip flop 470 toggles causing the start_b output 478 to go low and the end_b output 476 to go high. The start_b output going low provides a low input to the first fifteen gates 451–465 and, basically, maintains them high. Thus, the toggling of the NAND gate 570 and the output en_pfd is under the control of the output of the count sixteen gate 466.

The input to the count sixteen gate 466 includes the end_b signal from flip flop 460 and the Q output of the first four stages 501–504 of the counter 218. As the counter 218 counts from zero to 15, at least one of the inputs is low. Thus, the output of the gate 466 is high prior to the $16^{th}$ count. This makes all of the inputs to NAND gate 570 high and, therefore, its output en fd is low. Upon the termination of the $16^{th}$ count, all of the outputs of 501–504 are high. Thus, the output of NAND gate 466 is low. This low output on NAND gate 570 produces a high output signal en_pfd until the next count signal.

The reset signal RST on flip flop 470 of the rate selector circuit 400 and on 524 of flip flop 520 of the counter 218 is a signal received from monitoring the threshold of the capacitor 230 of filter 226. The reset signal RST is high until its threshold is reached. Thus, all of the stages 501–508 are reset before the threshold is reached. The NAND gates 451–465 receive the end_b signal, and gate 466 receives the start_b signal. Since these are opposite, the outputs of one of the logic gates 451–466 will be low, and the output en_pfd through the NAND gate 570 will be high. This allows the charge pump 220 to operate in response to every count pulse in region A of the speed-up cycle.

Thus, it can be seen that the eight stage counter 218 forms a progressive counter from stages 1–16 using all eight stages. However, once it has reached its last value, only the first four stages are used as a traditional binary counter. The use of the eight stage counter in combination with the rate select circuit 400 produces the sequential and lock counting. It also provides the disable of the counter 218 during stage A of the speed-up circuit. The illustrated counter 218 has sixteen stages, which is more than the four stages for a minimum rate of $1/(2^4)$ or $\frac{1}{16}$.

Figure 12:
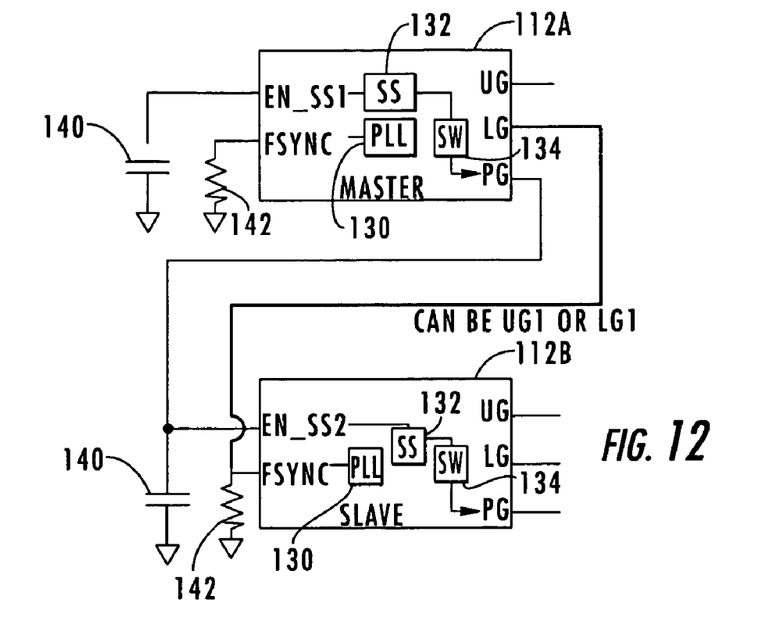
FIG. 12 is a block diagram illustrating the hand shake between a master and slave-PWM power controller, according to the principles of the present disclosure.
Figure 13:
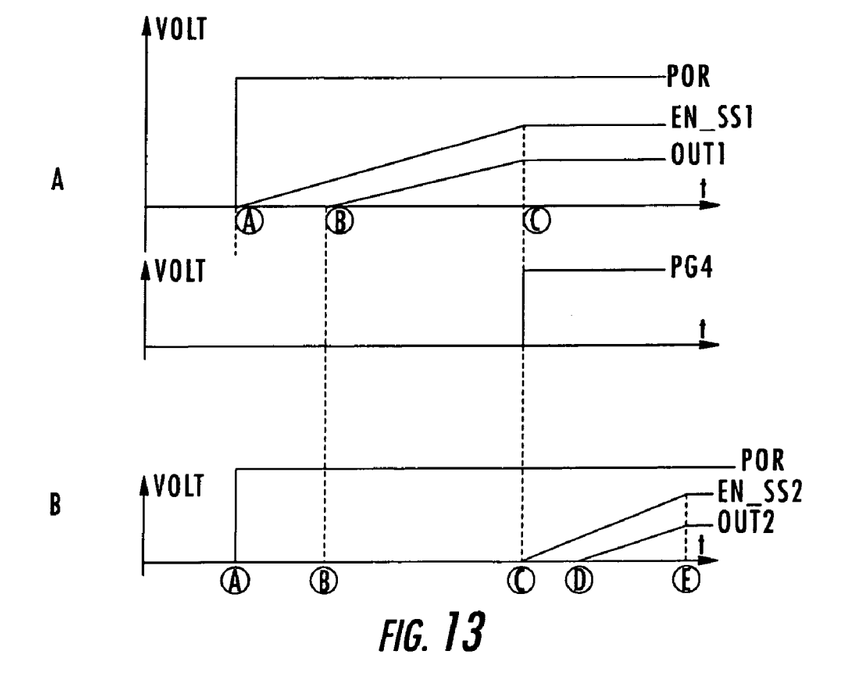
FIGS. 13A and 13B are graphs showing the soft-start cycle of the master/slave controllers of FIG. 12, according to the principles of the present disclosure.

In the master/slave set-up of FIG. 2, reduction of the time to allow the slave PLL to achieve lock is illustrated in the circuit of FIG. 12 and the diagram of FIG. 13. Each of the PWMs 112a, 112b have a soft-start. The soft-start is controlled by soft-start circuit SS 132, which is responsive to the input enable signal EN_SS. The soft-start circuit 132 controls a switch 134 to control the Power Good output PG, which indicates that the soft-start has terminated, and the output signals are considered to be good PWM signals. This is required because the power-up of the circuits and the PLL achieving this stable voltage is required. Connected to the soft-start enable input EN_SS is a capacitor 140. Connected to the synchronization input FSYNC or the input to the PLL is a resistor 142. The PG output of the master controller 112a is connected to the enable input EN_SS2 of the slave 112b. The LG output of the master 112a is connected to the FSYNC input of the slave 112b.

The operation of the interconnection of the master 112a and the slave 112b is illustrated in FIG. 13. FIG. 13A shows the master voltages, while FIG. 13B shows the slave voltages. Upon power-up POR, the voltage on the capacitor 140 of the master 112a begins to charge at time A. The slave 112b is also responsive to the power-up signal POR at time A. A short time later, an output is provided on LG as out 1 at time B. At time C, the output of the VCO or the voltage across the filter reaches a steady state as does the input voltage EN_SS1. At this point, the PG signal output of the master 112a goes high and stays high. This is a high impedance for an open drain circuit. This output is applied to the input of the EN_SS2 of the slave 112b and begins charging its capacitor 140. This starts the soft-start period of the slave 112b. At a short time period later at time D, the output out 2 starts rising. At time E, the input enable signal EN_SS2 reaches stable voltage. Although not shown, the slave 112a also provides a PG output signal at time E. The capacitor 140 of master controller 112a should be timed to determine a soft-start period which is greater than the time required for the PLL of slave controller 112b to lock.

Although the master controller 112a is outputting a signal LG or UG because of the soft-start, an output signal LG or UG is not considered an appropriate PWM signal since the PG signal is not present. The LG or UG signals are connected to the input FSYNC of the slave controller 112b during the period from time B to time C. This allows the slave controller 112b to begin to track the signal received from the master controller 112a. Thus, it does not start its tracking at time C but begins at time B. Thus, it starts tracking before it even begins its soft-start cycle. This allows the soft-start cycle of the slave controller 112b to be reduced since the tracking has already taken place. This shortens the start-up period for the slave controller 112b. This is advantageous alone or when used with the speed-up methods described above. The soft-start period of the master 112a may be set to be greater than the period of time for the slave's 112b PLL to achieve lock. This would make the soft-start period of the slave 112b independent of loop lock requirements. The values of the capacitors 140 are independently set to determine the soft-start period of each of the controllers 112.

FIG. 14 is a WAN transmitter/receiver 700 that can incorporate any of the PLLs of FIGS. 4 and 5, according to an embodiment of the invention. In addition to the PFD 200, charge pump 220, VCO 206, frequency divider 218 (omitted from FIG. 14 for clarity), rate selector RS circuit 300 and the filter 226 (omitted from FIG. 14 for clarity), the PLL includes a terminal 718 for receiving the reference signal and a local-oscillator (LO) distributor 720 for distributing the output of the VCO 206 as an LO signal. In addition to the PLL, the transmitter/receiver 700 includes a transmitter 704 and a receiver 706. The transmitter 704 includes a mixer 722 that modulates the LO with a differential base-band data signal received from a computer (not shown) via data terminals 724, 762. The transmitter 704 then provides this modulated data signal to a transmit-terminal 728 for wireless transmission to a remote receiver (not shown). Similarly, the receiver 706 receives a modulated data signal from a remote wireless transmitter (not shown) via a terminal 730, and includes a mixer 732 that demodulates the received data signal with the LO signal and provides a differential demodulated data signal to the computer via the terminals 724 and 726. The PLL is operable to synchronize the LO signal from the VCO 206 to the reference signal received on terminal 718. The transmitter/receiver 700 also includes other circuits that are conventional and that are thus omitted from FIG. 10 for brevity.

FIG. 15 is a block diagram of a general-purpose computer system 820 that incorporates the graphics board 100 of FIG. 1, according to an embodiment of the invention. The computer system 820 (e.g., personal or server) includes one or more processing units 821, system memory 822, and a system bus 823. The system bus 823 couples the various system components including the system memory 822 to the processing unit 821. The system bus 823 may be any of several types of busses (including a memory bus, a peripheral bus and a local bus) using any of a variety of bus architectures. The system memory 822 typically includes read-only memory (ROM) 824 and random-access memory (RAM) 825. Firmware 826 containing the basic routines that help to transfer information between elements within the computer system 820 is also contained within the system memory 822. The computer system 820 may further include a hard disk-drive system 827 that is also connected to the system bus 823. Additionally, optical drives (not shown), CD-ROM drives (not shown), floppy drives (not shown) may be connected to the system bus 823 through respective drive controllers (not shown) as well.

A user may enter commands and information into the computer system 820 through input devices such as a keyboard 840 and pointing device 842. These input devices, as well as others not shown, are typically connected to the system bus 823 through a serial port interface 846. Other interfaces (not shown) include Universal Serial Bus (USB) and parallel ports 840. A monitor 847 or other type of display device may also be connected to the system bus 823 via an interface such as the graphics card 100.

Although the present disclosure has been described and illustrated in detail, it is to be clearly understood that this is done by way of illustration and example only and is not to be taken by way of limitation. The scope of the present disclosure is to be limited only by the terms of the appended claims.

What is claimed is:

1. A phase-lock loop comprising:
an oscillator having an output oscillator signal whose frequency is related to a received error-correction signal;
a phase-frequency circuit receiving the oscillator signal and a reference signal and generating at a controllable rate error-correction pulses based on a phase difference between the oscillator signal and the reference signal;
a filter generating the error-correction signal from the error-correction pulses, the filter including a capacitor; and
a rate selector coupled to the capacitor and to the phase-frequency circuit, monitoring a charge on the capacitor, and controlling the rate at which the phase-frequency circuit generates the error-correction pulses to equal any one of more than two rates as a function of the charge on the capacitor.

2. The phase-lock loop according to claim 1, wherein:
the phase-detector circuit determines the phase difference between the oscillator and reference signals during phase-comparison cycles; and
the rate selector sets the rate of the error-connection pulses to once per each of the comparison cycles until the charge equals a first threshold value, and decreases the rate to less than once per each of the comparison cycles after the charge equals the first threshold value.

3. The phase-lock loop according to claim 2, wherein the rate selector detects a plurality of increasing threshold values of charge on the capacitor and, in response to the increasing threshold values of charge, causes the phase-frequency circuit to generate the error-correction pulses at respective decreasing rates.

4. The phase-lock loop according to claim 2, wherein the rate selector sets the rate of the error-correction pulses to a plurality of sequentially decreasing rates after the charge equals the first threshold.

5. The phase-lock loop according to claim 4, wherein the rate selector holds the rate of the error-correction pulses at a predetermined minimum rate once the rate decreases to the minimum rate.

6. The phase-lock loop according to claim 1, wherein the phase-frequency circuit includes a phase-frequency detector generating the error-correction pulses and includes a logic circuit between the phase-frequency detector and the filter which transmits the error-correction pulses to the filter under the control of the rate selector.

7. A pulse width modulation controller including a phase-lock loop according to claim 1; and wherein the reference signal is a master PWM signal and the oscillator signal is a slave PWM signal of the controller.

8. A power supply circuit comprising:
a main power supply;
a master PWM power supply that generates a first regulated supply voltage from the main power supply and that generates a master PWM signal; and
a slave PWM power supply that receives the master PWM signal and generates a second regulated supply voltage from the main power supply and includes a phase-lock loop; and
wherein the phase-lock loop is according to claim 1 and wherein the reference signal is the master PWM signal and the oscillator signal is a slave PWM signal used to regulate the second regulated supply voltage.

9. A power supply circuit comprising:
a main power supply;
a master PWM power supply that generates a first regulated supply voltage from the main power supply and that generates a master PWM signal; and
a slave PWM power supply that receives the master PWM signal and generates a second regulated supply voltage from the main power supply and includes a phase-lock loop;
wherein the phase-lock loop is according to claim 1 and wherein the reference signal is the master PWM signal and the oscillator signal is a slave PWM signal used to regulate the second regulated supply voltage;
wherein the master PWM power supply includes a soft-start circuit which generates a master disable signal during a predetermined master soft-start period beginning from start-up; and
wherein the slave PWM power supply includes a soft-start circuit which disables outputting of the slave PWM signal for a predetermined slave soft-start period beginning from termination of the master disable signal, and the phase-lock loop operates prior to the termination of master disable signal to lock on the master PWM signal.

10. The power supply circuit according to claim 9, wherein the master soft-start period is greater than a period of time for the slave's phase-lock loop to achieve lock.

11. A transmitter/receiver comprising:
a receiver circuit which generates a received base-band data signal from a modulated received signal and a local oscillator signal;
a transmitter circuit which generates a modulated transmission signal from a transmission base-band data signal and a local oscillator signal; and
a phase-lock loop coupled to the receiver and transmitter circuits; and
wherein the phase-lock loop is according to claim 1.

12. A computer system comprising:
a central processing unit connected to a bus system;
a video processor connected to the bus system, controlled by the central processing unit and including a power supply circuit;
a display device connected to the video processor; and
wherein the power supply circuit is according to claim 8.

13. A phase-lock loop comprising:
an oscillator having an output oscillator signal whose frequency is related to a received error-correction signal;
a phase-frequency circuit receiving the oscillator signal and a reference signal and generating at a controllable rate the error-correction pulses based on the a phase difference between the oscillator signal and the reference signal;
a filter generating the error-correction signal from the error-correction pulses, the filter including a capacitor;
a rate selector coupled to the capacitor and to the phase-frequency circuit, monitoring a charge on the capacitor, and controlling the rate at which the phase-frequency circuit generates of the error-correction pulses as a function of the charge on the capacitor;
wherein the phase-detector circuit determines the phase difference between the oscillator and reference signals during phase-comparison cycles;
wherein the rate selector sets the rate of the error-connection pulses to once per each of the comparison cycles until the charge equals a first threshold value, and decreases the rate to less than once per each of the comparison cycles after the charge equals the first threshold value;

wherein the rate selector includes a cycle counter to count the comparison cycles; and wherein the rate selector uses the counter to set the decreasing rates of the error-correction pulses.

14. A phase-lock loop comprising:

an oscillator having an output oscillator signal whose frequency is related to a received error-correction signal:

a phase-frequency circuit receiving the oscillator signal and a reference signal and generating at a controllable rate error-correction pulses based on a phase difference between the oscillator signal and the reference signal;

a filter generating the error-correction signal from the error-correction pulses, the filter including a capacitor;

a rate selector coupled to the capacitor and to the phase-frequency circuit, monitoring a charge on the capacitor, and controlling the rate at which the phase-frequency circuit generates the error-correction pulses as a function of the charge on the capacitor;

wherein the phase-detector circuit determines the phase difference between the oscillator and reference signals during comparison cycles;

wherein the rate selector includes a counter to count the comparison cycles; and wherein the rate selector causes the phase-frequency circuit to generate the error-correction pulses at a rate that is related to the count of the counter and to the capacitor voltage.

15. The phase-lock loop according to claim 14, wherein the rate selector uses the count of the counter to cause the phase-frequency circuit to generate the error-correction pulses at a plurality of sequentially decreasing rates after the charge equals a first threshold.

16. The phase-lock loop according to claim 15, wherein the rate selector holds the rate of the error-correction pulses at a predetermined minimum rate once the rate decreases to the minimum rate.

17. The phase-lock loop according to claim 14, wherein the counter is a binary counter having more than L stages, where $1/(2^L)$ is a minimum rate of the error-correction pulses; and the rate selector includes a logic circuit using the count of the stages and the voltage on the capacitor to set the rate of the error-correction pulses.

18. The phase-lock loop according to claim 17, wherein the counter has $2^L$ stages.

19. The phase-lock loop according to claim 18, wherein the logic circuit sequentially decreases the rate of the error-correction pulses to $1/(2^L)$.

20. The phase-lock loop according to claim 19, wherein the rate selector holds the rate of the error-correction pulses at the minimum rate once the rate decreases to the minimum rate.

21. The phase-lock loop according to claim 17, wherein the logic circuit use the L and more than L stages until the rate of the error-correction pulses decreases to the minimum rate; and the logic circuit use the L stages to hold the rate at the minimum rate once the rate decreases to the minimum rate.

* * * * *